United States Patent [19]
Ikeda et al.

[11] Patent Number: 5,331,247
[45] Date of Patent: Jul. 19, 1994

[54] SURFACE ACOUSTIC WAVE DEVICE AND COMMUNICATION DEVICE USING THE SAME

[75] Inventors: Hiroaki Ikeda, Kawasaki; Takashi Shiba, Yokosuka; Osamu Hikino, Fujisawa, all of Japan

[73] Assignee: Hitachi, Ltd., Tokyo, Japan

[21] Appl. No.: 933,305

[22] Filed: Aug. 21, 1992

[30] Foreign Application Priority Data

Aug. 22, 1991 [JP] Japan .................................. 3-211143
Oct. 28, 1991 [JP] Japan .................................. 3-281026

[51] Int. Cl.$^5$ .......................................... H01L 41/08
[52] U.S. Cl. ................... 310/313 B; 310/313 C
[58] Field of Search ................. 310/313 B, 313 C; 333/150–155, 193–196

[56] References Cited

U.S. PATENT DOCUMENTS

| | | | |
|---|---|---|---|
| 3,675,054 | 7/1972 | Jones | 310/313 B X |
| 4,464,597 | 8/1984 | Setsune | 310/313 B |
| 4,701,657 | 10/1987 | Grassl | 310/313 C |
| 4,728,912 | 3/1988 | Yuhara et al. | 310/313 B X |
| 4,774,482 | 9/1988 | Fleischmann | 333/193 |
| 4,918,349 | 4/1990 | Shiba et al. | 310/313 C |
| 5,021,699 | 6/1991 | Dufilie | 310/313 B |
| 5,162,689 | 11/1992 | Fliegel et al. | 310/313 B |
| 5,175,519 | 12/1992 | Yatsuda et al. | 310/313 B X |

*Primary Examiner*—Mark O. Budd
*Attorney, Agent, or Firm*—Antonelli, Terry, Stout & Kraus

[57] ABSTRACT

In an interdigital electrode of a surface acoustic wave device having nonexciting portions formed by removing fingers, fingers having an excitation source located nearest to a nonexciting portion in between are so positioned as to approach the nonexciting portion as compared with arrangement pitch of other fingers. Fingers having an excitation source located nearest to an end of the electrode in between are so positioned as to approach the end of the interdigital electrode as compared with arrangement pitch of other fingers. Fingers having an excitation source located in the central portion of the electrode group in between are so positioned as to approach each other as compared with arrangement pitch of other fingers.

14 Claims, 8 Drawing Sheets

DISTANCE OF MOVEMENT OF
EXCITATION SOURCE r (μm)

FIG. 7

DISTANCE OF MOVEMENT OF
EXCITATION SOURCE r (μm)

SURFACE ACOUSTIC WAVE DEVICE AND COMMUNICATION DEVICE USING THE SAME

BACKGROUND OF THE INVENTION

The present invention relates to a surface acoustic wave device (SAW device), and in particular to a surface acoustic device using a withdrawal weighted electrode.

As electrodes for surface acoustic wave devices such as SAW filters, electrodes of normal type, in which comb-like electrodes each having electrode width equivalent to gap width are interdigitated with equal finger overlap length everywhere, have conventionally been used.

If such an electrode of normal type having a uniform electrode finger overlap is used, it is known that a surface acoustic device has a frequency response H(f) represented by the following equation as described in Impulse Response Model Design of Acoustic Surface-Wave Filters (C. S. Hartmann et al.; IEEE TRANSACTIONS ON MICROWAVE THEORY AND TECHNIQUES, vol. MTT-21, No. 4, pp. 162-175, April, 1973)

$$H(f) = (\sin X)/X \cdot \exp(-j\omega N/2f_0)$$

$$X = N\pi(f-f_0)/f_0$$

where N, $\pi$, f, $f_0$ and $\omega$ denote the number of pairs of the electrode, the ratio of the circumference of a circle to its diameter, frequency, center frequency and angular frequency, respectively.

In case a surface acoustic wave device using such an electrode of normal type is utilized as a filter, however, small attenuation of side lobes brought about inconvenience in practical use.

On the other hand, overlap length weighted transducers having adjacent electrode fingers of comb-like electrodes changed in overlap length (as described in U.S. Pat. No. 3,663,899) are known as a technique for improving the attenuation of side lobes.

However, such overlap length weighted electrodes tend to be affected by diffracted waves. In general, overlap length weighted electrodes can be used in only one of two interdigital transducers provided in a surface acoustic wave device, and the other one of the two interdigital electrodes must be the above described electrode of normal type. That is to say, if a multistrip coupler is used, the above described overlap length weighted electrodes can be used in both of two interdigital electrodes of a surface acoustic wave device. In that case, however, the chip dimension of a piezoelectric surface acoustic wave substrate becomes large (F. G. Marshall et al., IEEE TRANSACTIONS ON MICROWAVE THEORY AND TECHNIQUES, vol. MTT-21, No. 4, pp. 206-215, 1973).

Therefore, a technique of a surface acoustic wave device in which parts of impulse excitation sources are removed by partly cutting away fingers of comb-like electrodes, i.e., a technique of a surface acoustic wave device using withdrawal weighted electrodes has been proposed (C. S. Hartmann; 1973 Ultrasonic Symposium Proceedings, pp. 423-426, 1973).

Such a surface acoustic wave device using withdrawal weighted electrodes can be used jointly with overlap length weighted electrodes without needing a multistrip coupler.

SUMMARY OF THE INVENTION

In the conventional technique of the surface acoustic wave device using withdrawal weighted electrodes, however, periodicity of finger arrangement is disturbed by cutting away fingers and forming a nonexciting portion. As compared with the case where fingers are not cut, therefore, the electric field distribution in the piezoelectric SAW substrate is biased from the nonexciting portion toward the electrode group.

The present inventors found that excitation sources located nearest to respective ends of a nonexciting portion formed by cutting fingers move from the nonexciting portion toward the electrode finger group as compared with the case where fingers are not cut whereas excitation sources located in the central portion of the electrode group move so that they may become apart from each other and hence a desired frequency response cannot be obtained resulting in inconvenience in practical use.

An object of the present invention is to provide a surface acoustic wave device using withdrawal weighted electrodes capable of mitigating deterioration of the frequency response due to movement of impulse excitation sources caused by cutting fingers.

In accordance with one aspect of the present invention, a surface acoustic wave device includes a surface acoustic wave substrate for propagating surface acoustic waves, and a plurality of interdigital electrodes provided on the surface acoustic wave substrate, at least one of the above described interdigital electrodes having a withdrawal weighted electrode formed by cutting away parts of fingers of the interdigital electrode arranged with a constant pitch on the surface acoustic wave substrate and disposing parts of fingers in areas displaced from the arrangement areas of the above described constant pitch.

In a surface acoustic wave device according to the present invention, movement of impulse excitation sources caused by bias of electric field distribution within the piezoelectric surface acoustic wave substrate is corrected by disposing parts of the above described fingers of the above described withdrawal weighted interdigital electrode in areas displaced from the above described arranged areas of the constant pitch.

DESCRIPTION OF THE PREFERRED EMBODIMENTS

Embodiments of the present invention will hereafter be described.

If an aperiodic place such as a cut electrode is present in an arrangement of fingers, the arrangement of impulse excitation sources is biased to the arrangement of fingers there, resulting in difficulty of electrode design. As the basic study for analysis and design, therefore, the present inventors conducted an experiment for quantitatively deriving the above described bias of excitation sources on the basis of experimental values by means of inverse Fourier transform for the simplest case of a cut electrode which will be hereafter described. In this experiment, samples of a split electrode structure having a center frequency of 36.36 MHz and a metallized ratio of 0.5, and including two electrode finger groups 28 each having five-pair of fingers with one gap 29 of a width W in between were used. As the substrates, piezoelectric substrates each made of a $LiNbO_3$ single crystal of 128° Y-axis cut (hereafter referred to as lithium niobate substrate) were used. The propagation direction of surface acoustic waves was defined as the X axis.

Figure 8:
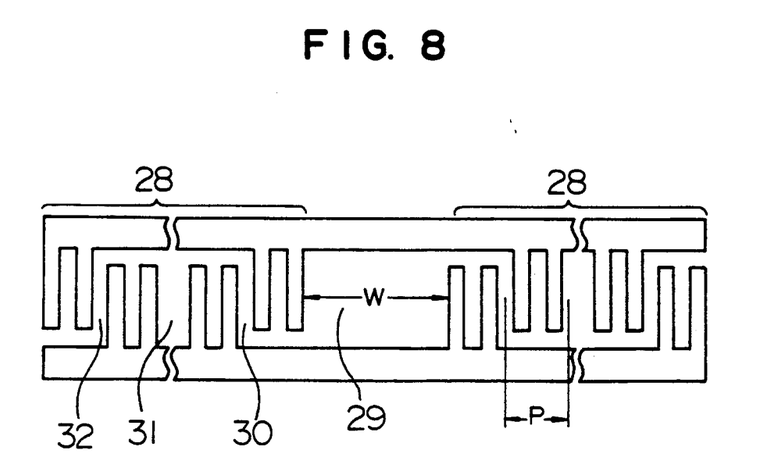
FIG. 8 is a schematic diagram showing the configuration of a sample used in a basic experiment for the first embodiment of the present invention.

For samples having different W, experimental values of measured frequency responses $S(\omega)$ and $\Phi(\omega)$ were subjected to inverse Fourier transform to calculate impulse response $h(t)$. As shown in FIG. 8, pitch P with respect to adjacent excitation source locations was derived to derive difference $\Delta P$ from the electrode pitch for each of an impulse excitation source location A30 located nearest to the gap, an excitation source location B31 located in the central portion of the electrode group, and an impulse excitation source location C32 located nearest to an end of the electrode group.

It was here assumed that the excitation source strength was constant.

Figure 9:
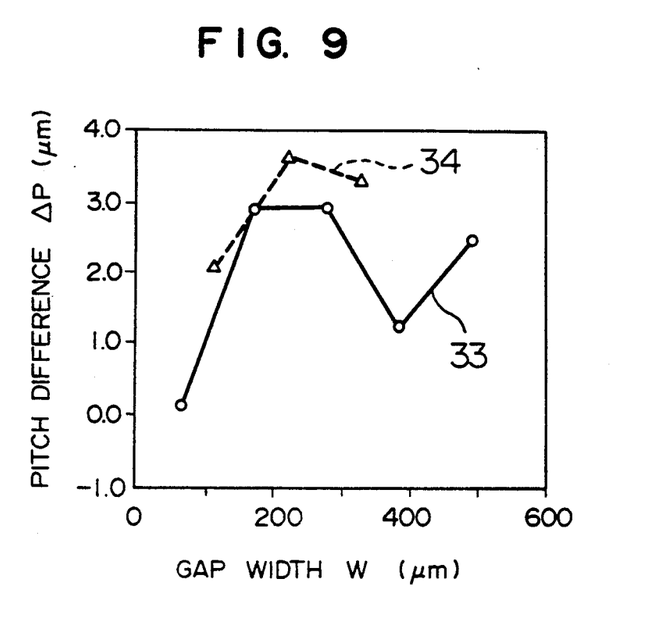
FIG. 9 is a characteristic diagram showing the result of a basic experiment for the first embodiment of the present invention.
Figure 10:
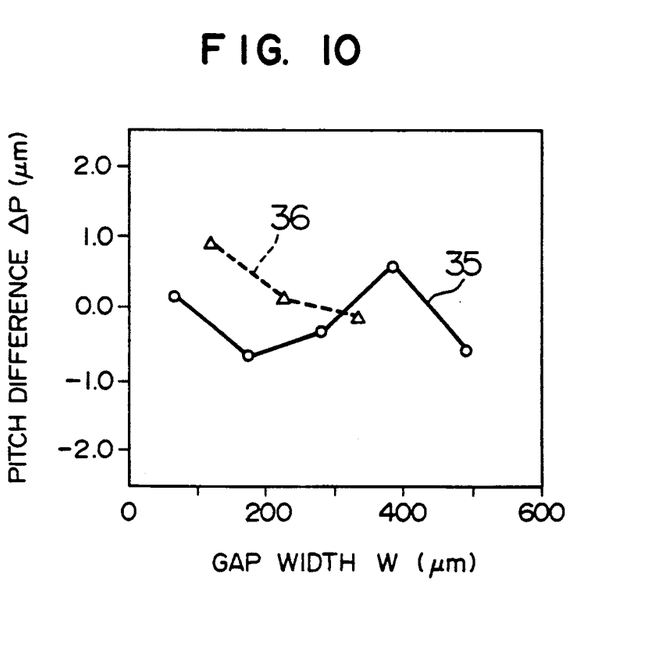
FIG. 10 is a characteristic diagram showing the result of a basic experiment for the second embodiment of the present invention.
Figure 11:
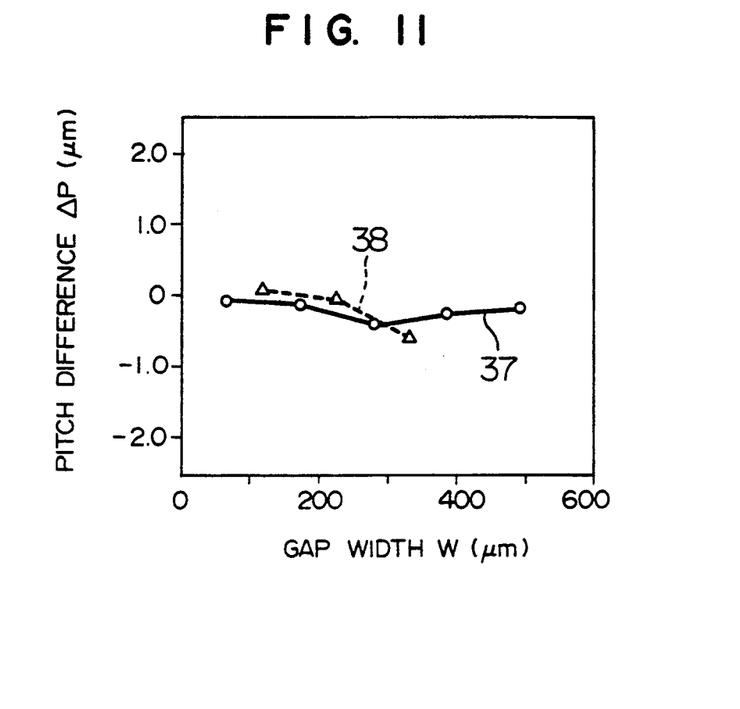
FIG. 11 is a characteristic diagram showing the result of a basic experiment for the third embodiment of the present invention.

For the above described excitation source locations A, B and C, change of pitch difference $\Delta P$ with the gap width W is shown in FIGS. 9, 10 and 11, respectively. In FIGS. 9, 10 and 11, numerals 33, 35 and 37 denote values of the case where the gap is sandwiched between fingers of opposite polarities, whereas numerals 34, 36 and 38 denote values of the case where the gap is sandwiched between fingers of the same polarity.

The excitation source location A nearest to the gap is influenced by the gap width W most strongly, and the excitation source pitch tends to become shorter than the electrode pitch. In the excitation source location C located farthest from the gap, the influence is slight. In the excitation source location B located in the central portion of the electrode group, the excitation source pitch tends to become longer than the electrode pitch in contrast with the excitation source location A. However, its change is smaller than that of the case of the excitation source location A. By the experiment heretofore described, the bias of excitation source from the finger arrangement could be qualitatively derived from experimental values of the frequency response by means of inverse Fourier transform for the simplest case of the cut electrode. It was confirmed that the bias value differed depending upon whether the excitation source was located in the location nearest to the gap, in the central portion of the electrode group, or in the location farthest from the gap. Especially, it was confirmed that the bias of the excitation source became the greatest in the location nearest to the gap.

Considering this result, it was decided to make corrections on electrode disposition of a withdrawal weighted electrode, which was weighted by cutting away fingers, and confirm its effect by examining the change of the frequency response.

First of all, a first embodiment of the present invention will now be described.

Figure 1:
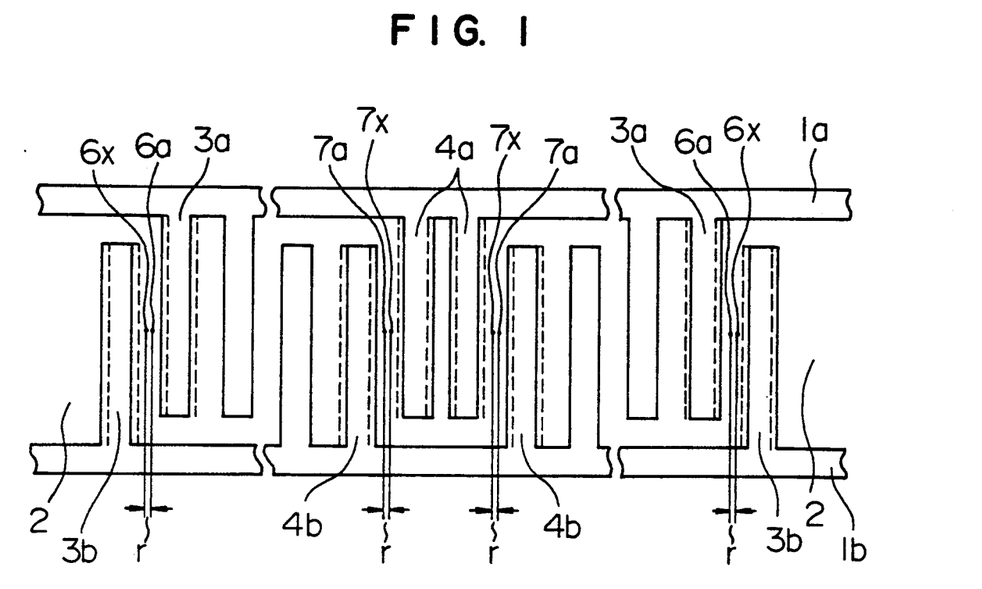
FIG. 1 is a schematic diagram showing the configuration of a surface acoustic wave device according to a first embodiment of the present invention.

FIG. 1 shows the configuration of a surface acoustic wave device according to the present first embodiment.

The surface acoustic wave device according to the present first embodiment is a surface acoustic wave device having a withdrawal weighted electrode provided on a surface acoustic wave substrate and carries out conversion between electric signals and surface acoustic signals.

The configuration of an interdigital electrode of a surface acoustic wave device according to the present first embodiment is shown in FIG. 1.

In the present first embodiment, lithium niobate substrates of 128° Y-axis cut were used as surface acoustic wave substrates. The propagation direction of surface acoustic waves was defined as the X axis. Alternatively, $LiTaO_3$ substrates (hereafter referred to as lithium tantalate substrates), crystal substrates, or substrates made of another material may be used as surface acoustic wave substrates.

In the present first embodiment, the interdigital electrode was made so as to have a center frequency maximizing the excitation efficiency at $f_0 = 36.36$ MHz and a split electrode structure with electrode width of 13.3 μm. The comb-like electrodes were formed on a surface acoustic wave substrate from an aluminum evaporation film having thickness of 6000 Å by means of the photolithography technique.

In the interdigital electrode according to the present first embodiment shown in FIG. 1, nonexciting portions formed by cutting fingers and electrode groups are alternately disposed. Parts of electrode groups are not illustrated.

As illustrated, the interdigital electrode include comb-like electrodes 1a and 1b each having a bus-bar connecting a plurality of fingers together. Nonexciting portions 2 are disposed partially in the interdigital electrode. Fingers having an impulse excitation source located nearest to a nonexciting portion in between and having electric polarities which are different from each other are fingers 3a and 3b. Fingers having an impulse excitation source located in the central portion of the electrode group in between and having electric polarities which are different from each other are fingers 4a and 4b.

In a surface acoustic wave device using conventional withdrawal weighted electrodes, positions of fingers having an impulse excitation source located nearest to a nonexciting portion in between and having electric polarities which are different from each other and fingers having an impulse excitation source located in the central portion of the electrode group in between and having electric polarities which are different from each other are represented by broken lines. As illustrated, all fingers have been conventionally disposed with constant metallized ratio and electrode pitch. In the present first embodiment, this metallized ratio is set to 0.5.

The present inventors measured attenuation of side lobe level in the frequency response of this interdigital electrode while translating the fingers 3a and 3b, which had the impulse excitation source located nearest to the nonexciting portion in between, from the above described conventional positions toward the non-exciting portion 2 along the main propagation direction of surface acoustic waves. Subsequently, the present inventors measured attenuation of side lobe level in the frequency response of this interdigital electrode while translating the fingers 4a and 4b, which had the impulse excitation source located in the central portion of the electrode group in between, from the above described conventional positions so as to bring the fingers 4a and 4b closer to each other along the main propagation direction of surface acoustic waves. Results of the measurement are represented by curves 5a and 5b in FIG. 6.

Figure 6:
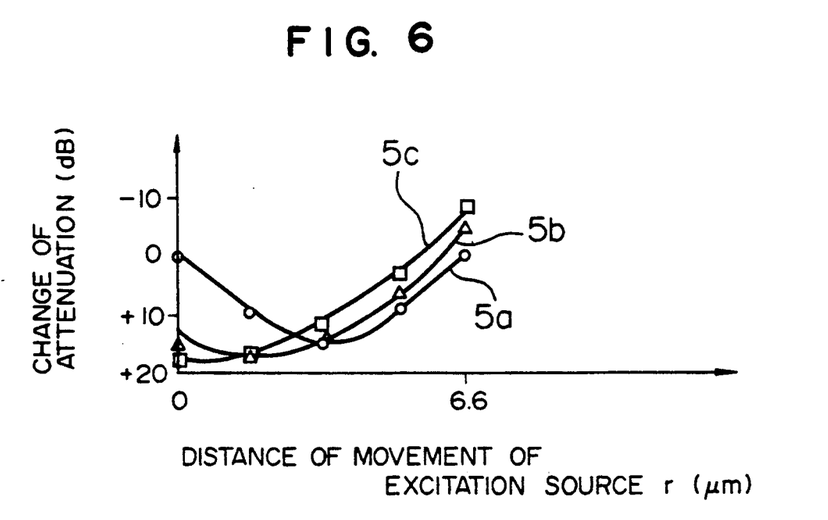
FIG. 6 is a characteristic diagram showing relationship between attenuation of side lobe level and distance of finger movement for a surface acoustic wave device according to the first embodiment of the present invention and a surface acoustic wave device according to the second embodiment of the present invention.

As illustrated, degradation of side lobe level can be reduced as compared with the conventional technique by suitably choosing a value in the range $0 < r < 6.6 \, \mu m$ as a movement distance r.

When a middle point 6a of the fingers having the impulse excitation source located nearest to the nonexciting portion in between is moved to a point 6x located nearer to the nonexciting portion 2 along the main propagation direction of surface acoustic waves, resultant relations between the distance r of movement and attenuation of side lobe level in the frequency response of the interdigital electrode are indicated by the curve 5a. As for the impulse excitation source located nearest to the nonexciting portion, a distance r of 3.3 μm which yielded the best result in measurements was chosen as the position of fingers in the present first embodiment. When the distance r of 3.3 μm is chosen as the position of fingers for the impulse excitation source located nearest to the nonexciting portion and middle points 7a of the fingers respectively having the impulse excitation sources located in the central portion of the finger group in between are moved toward points 7x in such opposite directions as to bring them closer to each other along the main propagation direction of surface acoustic waves, resultant relations between the distance r of movement and attenuation of side lobe level in the frequency response of the interdigital electrode are indicated by the curve 5b. As for the impulse excitation sources located in the central portion of the electrode group, a distance r of 2.5 μm which yielded the best result in measurements was chosen as the position of fingers in the present first embodiment.

Figure 2:
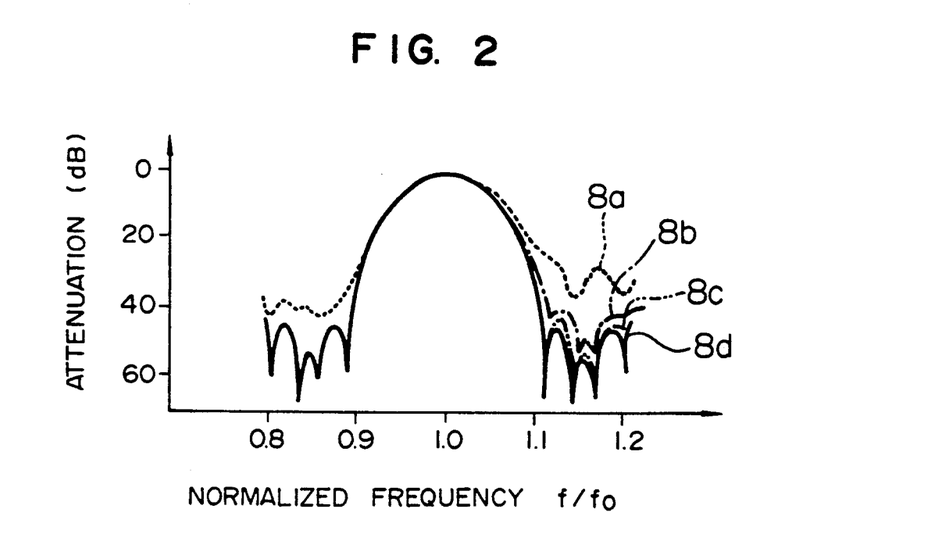
FIG. 2 is a characteristic diagram showing the frequence response of a surface acoustic wave device according to the first embodiment of the present invention.

A frequency response of the interdigital electrode obtained when the distance r for the impulse excitation source located nearest to the nonexciting portion is approximately 3.3 μm is indicated by a curve 8b. A frequency response of the interdigital electrode obtained when the distance r for the impulse excitation source located nearest to the nonexciting portion is approximately 3.3 μm and the distance r for the impulse excitation source located in the central portion of the electrode group is approximately 2.5 μm is indicated by a curve 8c. Curve 8a represents the frequency response of the conventional technique. As illustrated, the curve 8c indicates approximately the same response in the vicinity of the center frequency as that of the curve 8a whereas the curve 8c has a side lobe level lowered by 17 dB at its maximum from that of the curve 8a.

In case of a split electrode structure, it is now assumed that the middle point 6a of fingers having the impulse excitation source located nearest to the nonexciting portion in between, a middle point of fingers having an impulse excitation source located second nearest to the nonexciting portion in between, and a middle point of fingers having an impulse excitation source third nearest to the nonexciting portion in between have a distance p between adjacent middle points. In general, optimum positions of fingers may be derived under the condition that the distance r of movement is in the range $0 < r < (p/8)$. Assuming that the center frequency of the interdigital electrode is $f_0$ and the propagation velocity of surface acoustic waves is v, the distance p can be represented by $p = v/2f_0$.

In the foregoing description of the present embodiment, the case where two impulse excitation sources are disposed in the central portion of the electrode group has been described. For the case where one impulse excitation source was disposed in the central portion, however, fingers having two impulse excitation sources adjacent to this impulse excitation source in between were moved in such opposite directions as to bring them closer to each other along the main propagation direction of surface acoustic waves and relations between a distance 2*r of movement and attenuation of side lobe level in the frequency response of the interdigital electrode were investigated by means of a similar experiment. A large difference was not found between the two cases.

A second embodiment of the present invention will now be described.

Figure 3:
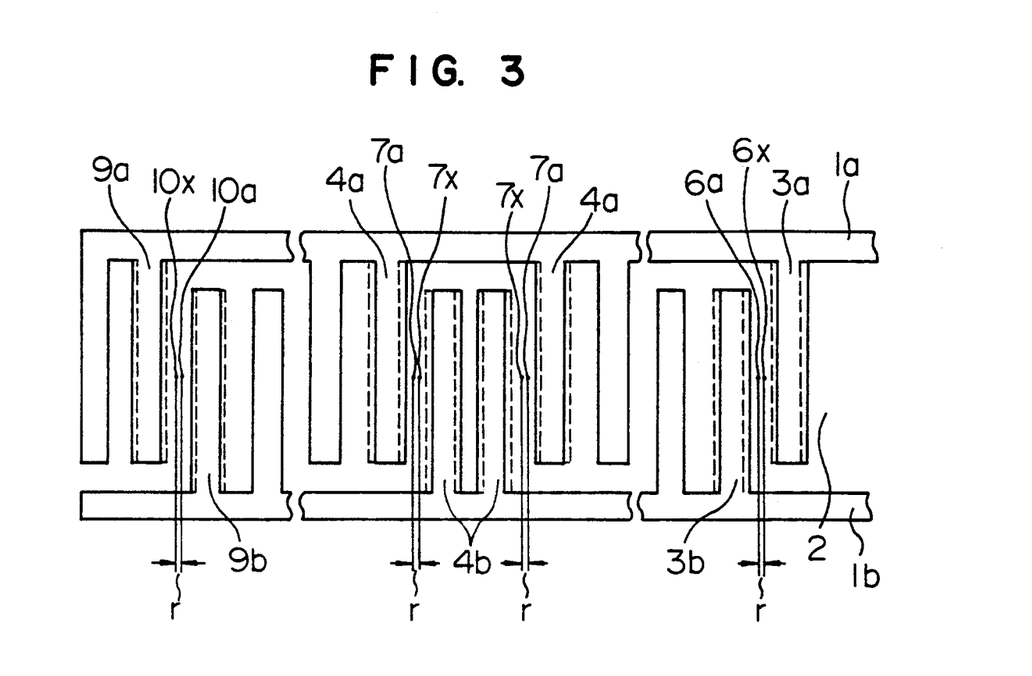
FIG. 3 is a schematic diagram showing the configuration of a surface acoustic wave device according to a second embodiment of the present invention.

FIG. 3 shows the configuration of a surface acoustic wave device according to the present second embodiment.

The surface acoustic wave device according to the present second embodiment is a surface acoustic wave device having a withdrawal weighted electrode provided on a surface acoustic wave substrate and carries out conversion between electric signals and surface acoustic signals.

The configuration of an interdigital electrode of a surface acoustic wave device according to the present second embodiment is shown in FIG. 3.

In the present second embodiment, lithium niobate substrates of 128° Y-axis cut were used as surface acoustic wave substrates. The propagation direction of surface acoustic waves was defined as the X axis. Alternatively, lithium tantalate substrates, crystal substrates, or substrates made of another material may be used as surface acoustic wave substrates.

In the present second embodiment, the interdigital electrode was made so as to have a center frequency maximizing the excitation efficiency at $f_0 = 36.36$ MHz and a split electrode structure with electrode width of 13.3 μm. The interdigital electrode was formed on a surface acoustic wave substrate from an aluminum evaporation film having thickness of 6000 Å by means of the photolithography technique.

In the interdigital electrode according to the present second embodiment shown in FIG. 3, nonexciting portions formed by cutting fingers and electrode groups are alternately disposed. Only an end portion of the interdigital electrode is shown, and remaining portions are not illustrated.

As illustrated, the interdigital electrode includes comb-like electrodes 1a and 1b each having a bus-bar connecting a plurality of fingers together. Nonexciting portions 2 are disposed partially in the interdigital electrode. Fingers having an impulse excitation source located nearest to the nonexciting portion 2 in between and having electric polarities which are different from each other are fingers 3a and 3b. Fingers having an impulse excitation source located nearest to the end portion of the interdigital electrode in between and having electric polarities which are different from each other are fingers 9a and 9b. Fingers having an impulse excitation source located in the central portion of the electrode group in between and having electric polarities which are different from each other are fingers 4a and 4b.

In a surface acoustic wave device using conventional withdrawal weighted electrodes, positions of fingers having an impulse excitation source located nearest to the nonexciting portion 2 in between and having electric polarities which are different from each other, fingers having an impulse excitation source located nearest to the end portion of the interdigital electrode in between and having electric polarities which are different from each other, and fingers having an impulse excitation source located in the central portion of the electrode group in between and having electric polarities which are different from each other are represented by broken lines in FIG. 3. As illustrated, all fingers have been conventionally disposed with constant metallized ratio and electrode pitch. In the present second embodiment, this metallized ratio is set to 0.5.

The present inventors measured attenuation of side lobe level in the frequency response of the interdigital electrode while translating the fingers 3a and 3b, which had the impulse excitation source located nearest to the nonexciting portion in between, from the above described conventional positions toward the non-exciting portion 2 along the main propagation direction of surface acoustic waves. Subsequently, the present inventors measured attenuation of side lobe level in the frequency response of the interdigital electrode while translating the fingers 4a and 4b, which had the impulse excitation source located in the central portion of the electrode group in between, from the above described conventional positions so as to bring the fingers 4a and 4b closer to each other along the main propagation direction of surface acoustic waves. Subsequently, the present inventors measured attenuation of side lobe level in the frequency response of the interdigital electrode while translating the fingers 9a and 9b, which had the impulse excitation source located nearest to the end portion of the interdigital electrode in between and which had opposite electric polarities, from the above described conventional positions toward the outside of the interdigital electrode along the main propagation direction of surface acoustic waves. Results of the measurement are represented by curve 5c in FIG. 6.

As illustrated, degradation of side lobe level can be reduced as compared with the conventional technique by suitably choosing a value in the range $$0 < r < 6.65 \ \mu m$$

as a movement distance r.

When a middle point 10a of the fingers having the impulse excitation source located in the end portion of the interdigital electrode in between is moved to a point 10x located outside of the interdigital electrode along the main propagation direction of surface acoustic waves, resultant relations between the distance r of movement and attenuation of side lobe level in the frequency response of the interdigital electrode are indicated by the curve 5c.

In addition to the above described results of the first embodiment, a distance r of 1 μm which yielded the best result in measurements was chosen as the position of fingers for the impulse excitation source located in the end portion of the interdigital electrode represented by the curve 5c in the present second embodiment.

A frequency response of the interdigital electrode obtained when the distance r for the impulse excitation source located nearest to the nonexciting portion is approximately 3.3 μm, the distance r for the impulse excitation source located in the central portion of the electrode group is approximately 2.5 μm, and the distance r for the impulse excitation source located in the end portion of the interdigital electrode is approximately 1 μm is indicated by a curve 8d in FIG. 2. Curve 8a represents the frequency response of the conventional technique. As illustrated, the curve 8d indicates approximately the same response in the vicinity of the center frequency as that of the curve 8a whereas the curve 8d has a side lobe level lowered by 18 dB at its maximum from that of the curve 8a.

In the foregoing description of the present embodiment, the case where two impulse excitation sources are disposed in the central portion of the electrode group has been described. For the case where one impulse excitation source was disposed in the central portion, however, fingers having two impulse excitation sources adjacent to this impulse excitation source in between were moved in such opposite directions as to bring them closer to each other along the main propagation direction of surface acoustic waves and relations between a distance 2*r of movement and attenuation of side lobe level in the frequency response of the interdigital electrode were investigated by means of a similar experiment. A large difference was not found between the two cases.

A third embodiment of the present invention will now be described.

Figure 4:
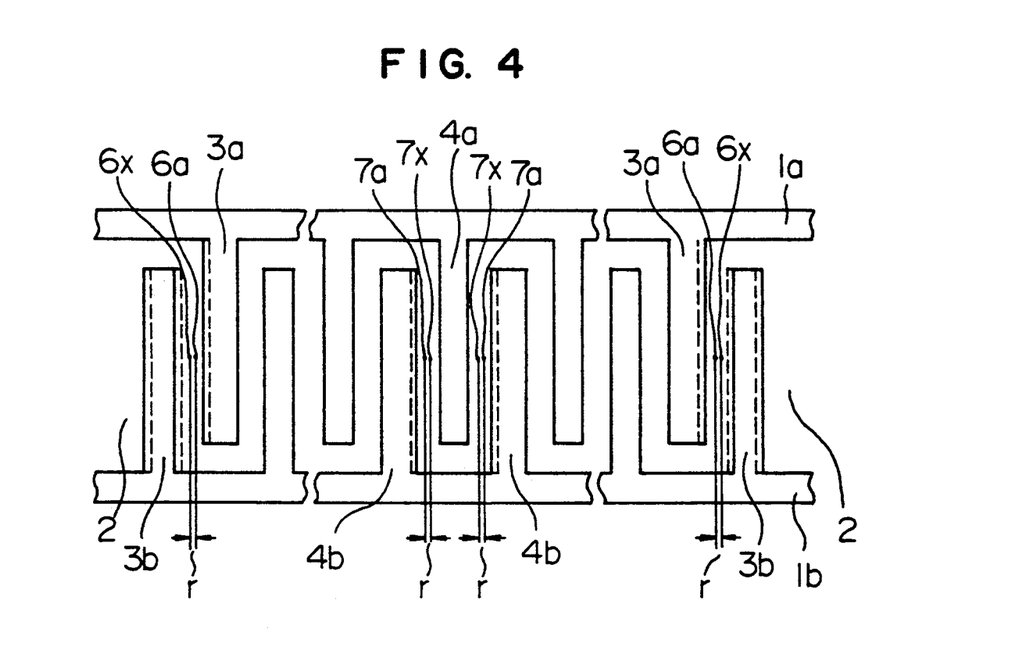
FIG. 4 is a schematic diagram showing the configuration of a surface acoustic wave device according to a third embodiment of the present invention.
Figure 5:
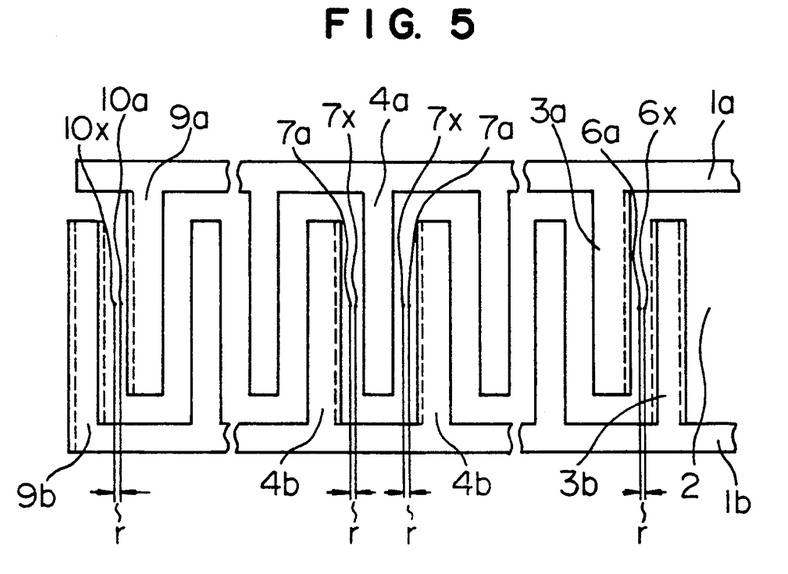
FIG. 5 is a schematic diagram showing the configuration of a surface acoustic wave device according to a third embodiment of the present invention.

FIGS. 4 and 5 show the configuration of a surface acoustic wave device according to the present third embodiment.

The surface acoustic wave device according to the present third embodiment is a surface acoustic wave device having a withdrawal weighted electrode provided on a surface acoustic wave substrate and carries out conversion between electric signals and surface acoustic signals.

In the present third embodiment, lithium niobate substrates of 128° Y-axis cut were used as surface acoustic wave substrates. The propagation direction of surface acoustic waves was defined as the X axis. Alternatively, lithium tantalate substrates, crystal substrates, or substrates made of another material may be used as surface acoustic wave substrates.

In the present third embodiment the interdigital electrode was made so as to have a center frequency maximizing the excitation efficiency at $f_0 = 36.36$ MHz and a solid electrode structure with electrode width of 26.6 μm. The interdigital electrode was formed on a surface acoustic wave substrate from an aluminum evaporation film having thickness of 6000 Å by means of the photolithography technique.

In the interdigital electrode according to the present third embodiment shown in FIG. 4, nonexciting portions formed by cutting fingers and electrode groups are alternately disposed. Parts of the electrode group are not illustrated. In the interdigital electrode according to the present third embodiment shown in FIG. 5, nonexciting portions formed by cutting fingers and electrode groups are alternately disposed. Only an end portion of the interdigital electrode is shown, and remaining portions are not illustrated.

As shown in FIGS. 4 and 5, the interdigital electrode includes comb-like electrodes 1a and 1b each having a bus-bar connecting a plurality of fingers together. Nonexciting portions 2 are disposed partially in the comb-like electrodes. Fingers having an impulse excitation source located nearest to the nonexciting portion in between and having electric polarities which are different from each other are fingers 3a and 3b. Fingers having an impulse excitation source located in the central portion of the electrode group in between and having electric polarities which are different from each other are fingers 4a and 4b. Fingers having an impulse excitation source located nearest to the end portion of the interdigital electrode in between and having electric polarities which are different from each other are fingers 9a and 9b.

In a surface acoustic wave device using conventional withdrawal weighted electrodes, positions of fingers having an impulse excitation source located nearest to the nonexciting portion in between and having electric polarities which are different from each other and fingers having an impulse excitation source located in the central portion of the electrode group in between and having electric polarities which are different from each other are represented by broken lines in FIG. 4. Further, in a surface acoustic wave device using conventional withdrawal weighted electrodes, positions of fingers having an impulse excitation source located nearest to the nonexciting portion 2 in between and having electric polarities which are different from each other and fingers having an impulse excitation source located nearest to the end portion of the interdigital electrode in between and having electric polarities which are different from each other are represented by broken lines in FIG. 5. As illustrated, all fingers have been conventionally disposed with constant metallized ratio and electrode pitch. In the present third embodiment, this metallized ratio is set to 0.5.

The present inventors measured attenuation of side lobe level in the frequency response of this interdigital electrode while translating the fingers 3a and 3b, which had the impulse excitation source located nearest to the nonexciting portion in between, from the above described conventional positions toward the non-exciting portion 2 along the main propagation direction of surface acoustic waves. Subsequently, the present inventors measured attenuation of side lobe level in the frequency response of the interdigital electrode while translating the fingers 4a and 4b, which had the impulse excitation source located in the central portion of the electrode group in between, from the above described conventional positions so as to bring the fingers 4a and 4b closer to each other along the main propagation direction of surface acoustic waves. Subsequently, the present inventors measured attenuation of side lobe level in the frequency response of the interdigital electrode while translating the fingers 9a and 9b, which had the impulse excitation source located nearest to the end portion of the interdigital electrode in between and which had opposite electric polarities, from the above described conventional positions toward the outside of the interdigital electrode along the main propagation direction of surface acoustic waves. Results of the measurements are represented by curves 11a, 11b and 11c in FIG. 7.

Figure 7:
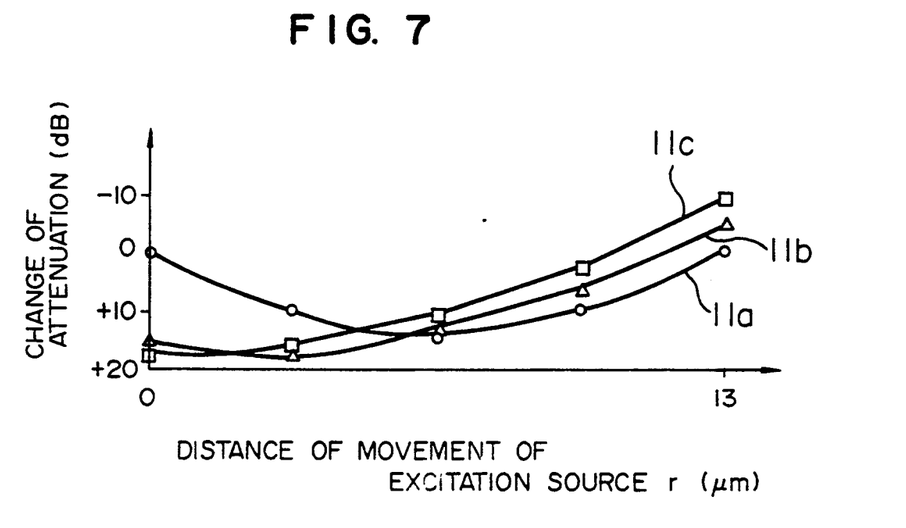
FIG. 7 is a characteristic diagram showing relationship between attenuation of side lobe level and distance of finger movement for a surface acoustic wave device according to the third embodiment of the present invention.

As illustrated, degradation of side lobe level can be reduced as compared with the conventional technique by suitably choosing a value in the range $$0 < r < 13 \, \mu m$$

as a movement distance r. As for the impulse excitation source located nearest to the nonexciting portion represented by the curve 11a, a distance r of 6.6 μm which yielded the best result in measurements was chosen as the position of fingers in the present third embodiment. When the distance r of 6.6 μm is chosen as the position of fingers for the impulse excitation source located nearest to the nonexciting portion and middle points 7a of the fingers respectively having the impulse excitation sources located in the central portion of the finger group in between are moved toward points 7x in such opposite directions as to bring them closer to each other along the main propagation direction of surface acoustic waves, resultant relations between the distance r of movement and attenuation of side lobe level in the frequency response of the interdigital electrode are indicated by the curve 11b. As for the impulse excitation sources located in the central portion of the electrode group represented by the curve 11b, a distance r of 5 μm which yielded the best result in measurements was chosen as the position of fingers in the present third embodiment.

When a middle point 10a of the fingers having the impulse excitation source located in the end portion of the interdigital electrode in between is moved to a point 10x located outside of the interdigital electrode along the main propagation direction of surface acoustic waves under the condition that the distance r of 6.6 μm is chosen as the position of fingers for the impulse excitation source located nearest to the nonexciting portion and the distance r of 5 μm is chosen as the position of fingers for the impulse excitation source located in the central portion of the electrode group, resultant relations between the distance r of movement and attenuation of side lobe level in the frequency response of the interdigital electrode are indicated by the curve 11c.

In addition to the results described before with reference to the curves 11a and 11b, a distance r of 1 μm which yielded the best result in measurements was chosen in the present third embodiment as the position of fingers for the impulse excitation source located in the end portion of the interdigital electrode represented by the curve 11c.

When the distance r for the impulse excitation source located nearest to the nonexciting portion is approximately 6.6 μm, the distance r for the impulse excitation source located in the central portion of the electrode group is approximately 5 μm, and the distance r for the impulse excitation source located in the end portion of the interdigital electrode is approximately 1 μm, the frequency response of the interdigital electrode becomes the best. As compared with the conventional frequency response, the response in the vicinity of the center frequency is approximately the same and the side lobe level is lowered by approximately 18 dB.

In case of a solid electrode structure, it is now assumed that the middle point 6a of fingers having the impulse excitation source located nearest to the nonexciting portion in between, a middle point of fingers having an impulse excitation source located second nearest to the nonexciting portion in between, and a middle point of fingers having an impulse excitation source third nearest to the nonexciting portion in between have a distance p between adjacent middle points. In general, optimum positions of fingers may be derived under the condition that the distance r of movement is in the range $0<r<(p/4)$. Assuming that the center frequency of the interdigital electrode is $f_0$ and the propagation velocity of surface acoustic waves is v, the distance p can be represented by $p=v/2f_0$.

In the foregoing description of the present embodiment, the case where two impulse excitation sources are disposed in the central portion of the electrode group has been described. For the case where one impulse excitation source was disposed in the central portion, however, fingers having two impulse excitation sources adjacent to this impulse excitation source in between were moved in such opposite directions as to bring them closer to each other along the main propagation direction of surface acoustic waves and relations between a distance 2*r of movement and attenuation of side lobe level in the frequency response of the interdigital electrode were investigated by means of a similar experiment. A large difference was not found between the two cases.

In the nonexciting portion wherefrom an excitation source has been removed, the piezoelectric substrate is exposed. The propagation velocity of the surface acoustic wave propagated on the surface of the substrate in the nonexciting portion is faster as compared with the case where fingers are formed in the nonexciting portion. In case of a lithium niobate substrate, for example, a propagation velocity difference of approximately 3% is obtained between the case where the surface is covered by aluminum and the case where the surface is not covered.

In the interdigital electrode of any one of the above described first to third embodiments, such a correction as to make the apparent velocity difference equivalent to zero may be made by widening the exposure width of the nonexciting portion.

In this case, optimum positions of arrangement may be derived in the interdigital electrode subjected to the above described correction by moving fingers as described before.

In such a case as well, the frequency response of the interdigital electrode is nearly the same in the vicinity of the center frequency and the side lobe level can be improved by approximately 15 dB as compared with the frequency response of the case where fingers are not moved.

Supposing that there is no change of electric field distribution of the nonexciting portion caused by removing fingers of the cut and weighted interdigital electrode, the surface acoustic wave device of each of the embodiments heretofore described can be designed by disposing fingers so as to generate time response of impulse excitation at constant time intervals, with the exception of an interval corresponding to the above described nonexciting portion, and at least one time point selected out of a time point of impulse excitation adjacent to the interval corresponding to the above described nonexciting portion and time points of earliest impulse excitation and last impulse excitation, and so as to make a time interval beginning from at least one time point selected out of a time point of impulse excitation adjacent to the interval corresponding to the above described nonexciting portion and time points of earliest impulse excitation and last impulse excitation and lasting until a time point of impulse excitation adjacent to the above described at least one time point longer than the above described constant time interval. As for the central portion of the finger group, the surface acoustic wave device can be designed by disposing fingers so as to make the time interval of impulse excitation shorter than the above described constant time interval.

In the above described first, second and third embodiments, the nonexciting portion is sandwiched between fingers having electric polarities which are different from each other (FIG. 8). For the case where the nonexciting portion was sandwiched between fingers having electric polarities which were identical with each other, the present inventors made experiments by using a similar procedure. As a result, it was found that the side lobe level could be improved in the same way as the first, second and third embodiments.

A fourth embodiment of the present invention will now be described.

In the present fourth embodiment, movement of fingers performed in the above described first, second and third embodiments is performed by another technique.

Figure 15:
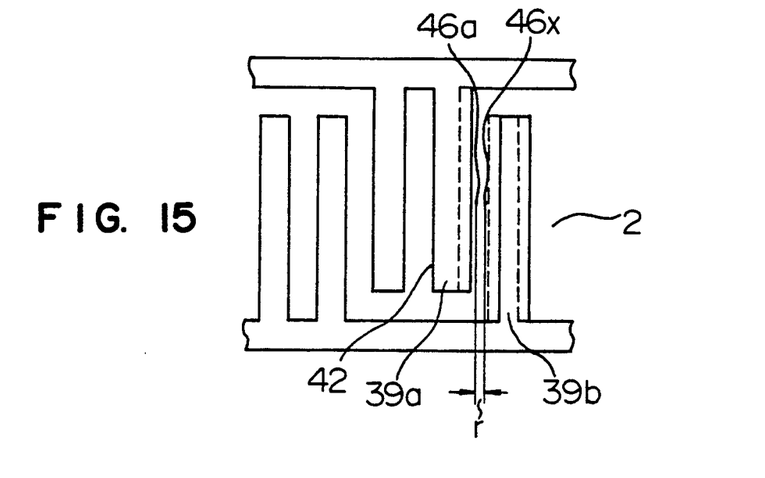
FIG. 15 is a characteristic diagram showing the result of a basic experiment for a fourth embodiment of the present invention.
Figure 16:
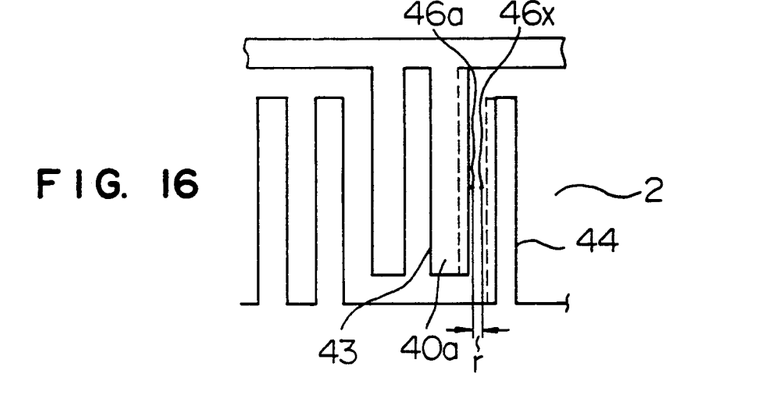
FIG. 16 is a characteristic diagram showing the result of a basic experiment for the fourth embodiment of the present invention.
Figure 17:
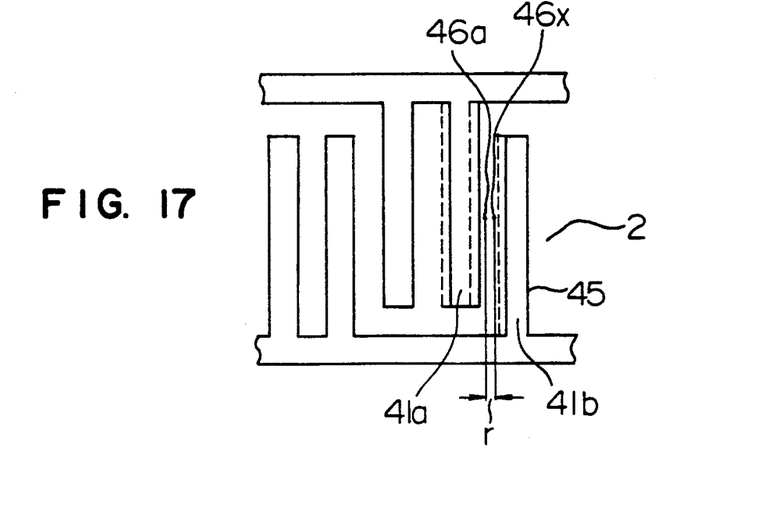
FIG. 17 is a characteristic diagram showing the result of a basic experiment for the fourth embodiment of the present invention.

FIGS. 15, 16 and 17 show this movement technique. In each of FIGS. 15, 16 and 17, only the vicinity of boundary with respect to a nonexciting portion is shown.

For a surface acoustic wave device using conventional withdrawal weighted electrodes, positions of fingers having an impulse excitation source located nearest to the nonexciting portion 2 in between and having electric polarities which are different from each other are indicated by broken lines in each of FIGS. 15, 16 and 17. Fingers having an impulse excitation source located nearest to the nonexciting portion in between are denoted by 39a and 39b in FIG. 15, 40a and 40b in FIG. 16, and 41a and 41b in FIG. 17.

The present inventors measured attenuation of side lobe level in the frequency response of the interdigital electrode while translating fingers, which had the impulse excitation source located nearest to the nonexciting portion 2 in between, from the above described conventional positions toward the nonexciting portion 2 along the main propagation direction of surface acoustic waves.

In case shown in FIG. 15, the position of side 42 of a finger 39a located on the opposite side of the impulse excitation source nearest to the nonexciting portion 2 remains fixed.

In case shown in FIG. 16, the position of side 43 of a finger 40a located on the opposite side of the impulse excitation source nearest to the nonexciting portion 2 and the position of side 44 of a finger 40b located on the opposite side of the impulse excitation source nearest to the nonexciting portion 2 remain fixed.

In case shown in FIG. 17, the position of side 45 of a finger 41b located on the opposite side of the impulse excitation source nearest to the nonexciting portion 2 remains fixed.

In each case, a middle point 46a of the fingers having the impulse excitation source located nearest to the nonexciting portion 2 in between was moved to a point 46x located nearer to the nonexciting portion 2 along the main propagation direction of surface acoustic waves. Then relations between the distance r of movement and attenuation of side lobe level in the frequency response of the interdigital electrode were examined. In the same way as the above described first, second and third embodiments, the frequency response of the interdigital electrode became the best when r was approximately 3.3 μm. As compared with the frequency response obtained when the point 46a was not moved, the response near the center frequency was nearly the same and the side lobe level was lowered by approximately 15 dB. In the present fourth embodiment as well, therefore, the distance r of 3.3 μm which yielded the best result in measurements was chosen as the position of fingers.

Such a technique of movement also makes it possible to improve the attenuation of side lobe level by deriving optimum positions of fingers and disposing the fingers in those positions.

A fifth embodiment of the present invention will now be described.

Figure 12:
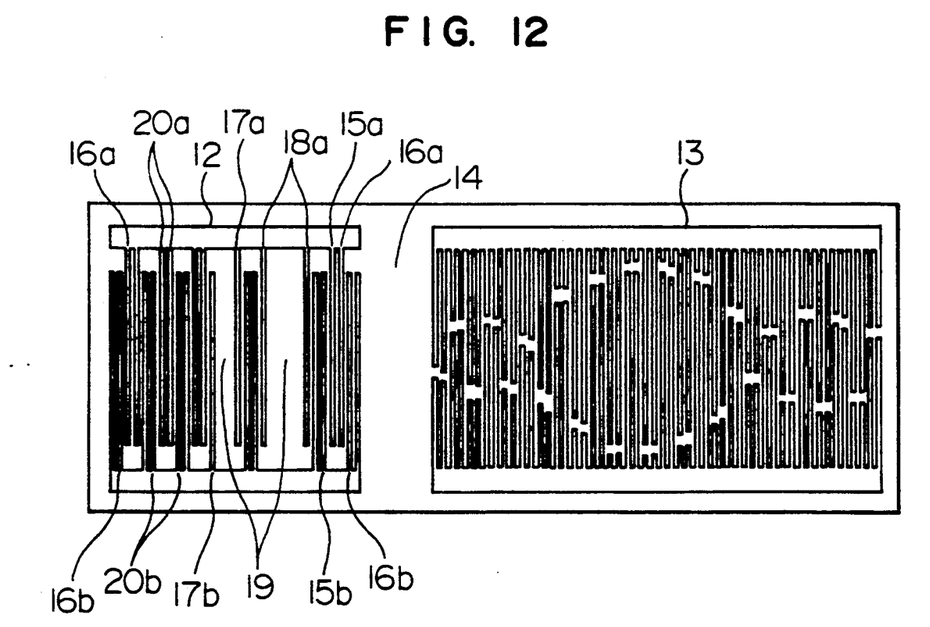
FIG. 12 is a configuration diagram showing the configuration of a surface acoustic wave device according to a fifth embodiment of the present invention.

FIG. 12 shows the configuration of a surface acoustic wave (SAW) filter according to the fifth embodiment of the present invention.

This SAW filter is an intermediate frequency filter having a center frequency of $f_0 = 36.36$ MHz according to German standards for TV receivers and has an interdigital input electrode 12 and an output electrode 13. As a surface acoustic wave substrate, a lithium niobate substrate of 128° Y-axis cut was used. The propagation direction of surface acoustic waves was defined as the X axis. Alternatively, a lithium tantalate substrate, a crystal substrate, or a substrate made of another material may be used as the surface acoustic wave substrate 14.

In the present fifth embodiment, the interdigital electrodes used in the above described first to third embodiments were used as the interdigital input electrode 12.

That is to say, the input electrode 12 has comb-like interdigitating fingers 15a and 15b and fingers 16a and 16b having an impulse excitation source located nearest to an end portion of the interdigital electrode in between and having electric polarities which are different from each other. Further, the input electrode has nonexciting portions 19 between fingers 17a and 17b and between fingers 18a. Nonexciting portions and electrode groups are alternately disposed. As compared with arrangement pitch of other fingers, fingers 16a and 16b are so disposed as to be displaced toward an end portion of the input electrode 12, and fingers 17a and 17b and fingers 18a are so disposed as to be displaced toward their respective nonexciting portions 19. Fingers 20a and 20b are so disposed as to be displaced in such opposite directions that they are brought closer to each other.

In the present fifth embodiment, an overlap length weighted electrode is used as the output electrode 13. However, the interdigital electrodes used in the first to third embodiments may also be used instead.

As a sixth embodiment of the present invention, a TV receiver using a surface acoustic wave device according to the above described fifth embodiment as an intermediate frequency filter will now be described.

Figure 13:
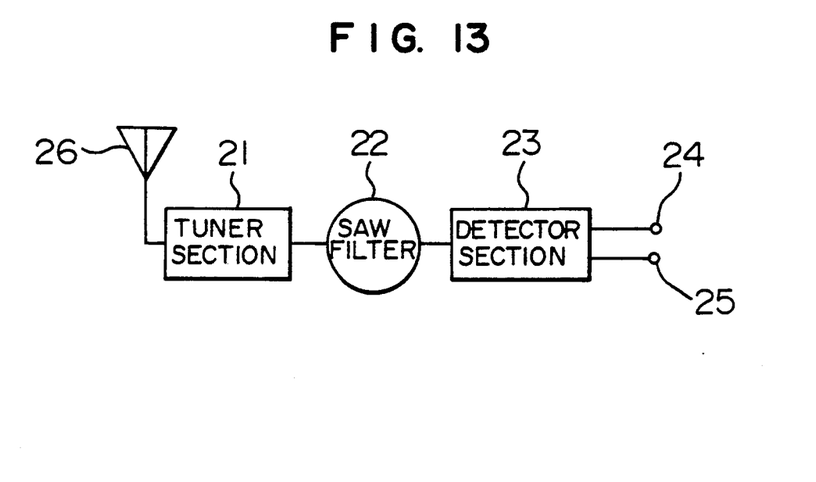
FIG. 13 is a block diagram showing the configuration of a TV receiver according to a sixth embodiment of the present invention.

FIG. 13 shows the configuration of a receiver section of a TV receiver according to the present sixth embodiment.

In FIG. 13, numeral 21 denotes a tuner section, 22 a SAW filter, 23 a detector section, 24 a video output signal, 25 an audio signal output, and 26 an antenna.

In such a receiver section of the TV receiver, a signal corresponding to one channel is extracted out of an intermediate frequency signal fed from the tuner section 21 by the SAW filter 22, transferred to the detector section 23, and divided into the video signal output 24 and the audio signal output 25. The video signal output 24 and the audio signal output 25 are outputted.

Figure 14:
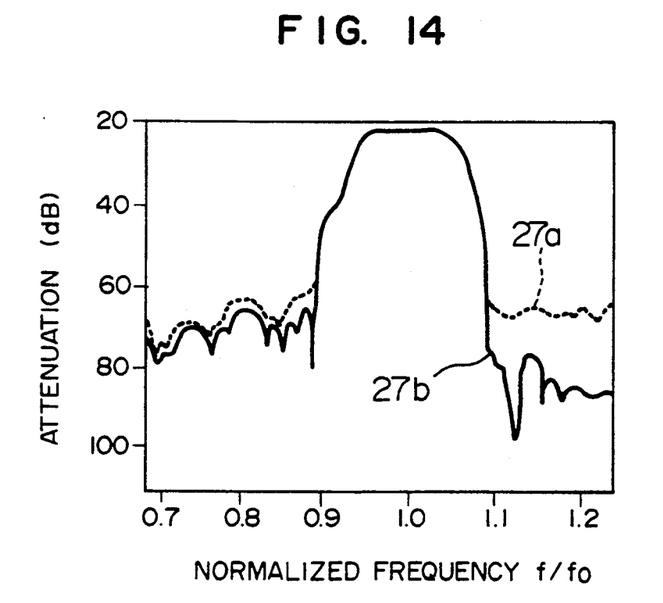
FIG. 14 is a characteristic diagram showing the frequency response of a surface acoustic wave device according to the first embodiment of the present invention.

FIG. 14 shows frequence response 27b of an intermediate frequency filter according to the present sixth embodiment.

By using a surface acoustic wave device according to the above described fifth embodiment as the intermediate frequency filter, its out-band frequency response has been improved by approximately 15 dB as illustrated as compared with frequence response 27a of the case where a conventional withdrawal weighted electrode having fingers arranged with a constant pitch is used as the input electrode.

In this way, the surface acoustic wave device according to the above described fifth embodiment can be used as intermediate frequency filters of various communication devices in addition to TV receivers.

Heretofore, examples of application of interdigital electrodes described with reference to the first to fourth embodiments to intermediate frequency filters have been described. However, the interdigital electrodes shown in the first to fourth embodiments can be applied to oscillators, correlators, RF filters and so on.

As heretofore described, according to the described embodiments, it is possible to make each of movement of impulse excitation position at the end of cut portion of fingers, movement of impulse excitation position in the central portion of each electrode group of the interdigital electrode, and movement of impulse excitation position in the end portion of the interdigital electrode equivalent to apparently zero and change the excitation strength of the surface acoustic wave without changing the overlap length between adjacent fingers of comb-like electrodes and without increasing the chip size of devices such as filters. As a result, effects similar to those of conventional weighted electrodes having Changed overlap length, and the side lobe level can be significantly improved. Thus, characteristics of SAW filters can be improved.

As for in-band characteristics as well, both the input electrode and the output electrode can be weighted and the degree of freedom of design of devices such as filters is significantly improved.

As heretofore described, it becomes possible to provide a surface acoustic wave device using withdrawal weighted electrodes capable of improving deterioration of the frequency response due to movement of impulse excitation sources caused by cutting fingers.

We claim:

1. A surface acoustic wave device comprising a surface acoustic wave substrate and a pair of interdigital electrodes formed on said substrate, each of said electrodes having a bus bar and a plurality of electrode fingers extending from said bus bar generally perpendicular thereto and interdigitated with electrode fingers of the other electrode so that finger pairs are formed between adjacent electrode fingers extending from different bus bars, wherein:

at least one withdrawal weighting gap is provided with respect to said pair of interdigital electrodes on said substrate such that said electrode fingers of said pair of interdigital electrodes are divided into a plurality of electrode finger groups, and no finger exists in said gap to form a nonexciting portion in said surface acoustic wave device, each of said electrode finger groups including electrode fingers regularly arranged with a predetermined pitch, said withdrawal weighting gap of said nonexciting portion having a width as viewed in a surface acoustic wave propagating direction equal to a distance between one electrode finger and another electrode finger not adjacent to said one electrode finger in said regularly arranged electrode fingers, said nonexciting portion causing a distortion of distribution of an electric field to be generated by electrode fingers of said pair of interdigital electrodes when an electric voltage is applied across said bus bars with all of said electrode fingers of said pair of interdigital electrodes being arranged with said predetermined pitch; and at least one distortion cancelling finger pair being included in each of said electrode finger groups and being arranged such that a length between a central line between said distortion cancelling finger pair and a central line between a finger pair adjacent to said distortion cancelling finger pair is different from a length between central lines between other adjacent two finger pairs in said regularly arranged electrode fingers in said electrode finger groups to cancel said distortion of the electric field distribution, said central lines being viewed generally in a lengthwise direction of said electrode fingers.

2. A surface acoustic wave device according to claim 1, wherein each of two distortion cancelling finger pairs adjacent to one nonexciting portion are arranged such that a length between a central line between a respective distortion cancelling finger pair and a central line between a finger pair adjacent to said respective distortion cancelling finger pair is larger than a length between central lines between other adjacent two finger pairs in said regularly arranged electrode fingers in an associated electrode finger groups.

3. A surface acoustic wave device according to claim 2, wherein each of two centrally located electrode finger pairs centrally located in each of said electrode finger groups are arranged such that a length between a central line between a respective centrally located finger pair and a central line between a finger pair outwardly adjacent to said respective centrally located finger pair is smaller than a length between central lines between other adjacent two finger pairs in said regularly arranged electrode fingers in an associated electrode finger group.

4. A surface acoustic wave device according to claim 3, wherein an electrode outer-most finger pair located outermostly of said surface acoustic wave device are arranged such that a length between a central line between said outer-most finger pair and a central line between a finger pair adjacent to said outer-most finger pair is larger than a length between central lines between other adjacent two finger pairs in said regularly arranged electrode fingers in an associated electrode finger group.

5. A surface acoustic wave device according to claim 4, wherein said length between a central line between said distortion cancelling finger pair adjacent to said one nonexciting portion and a central line between a finger pair adjacent to said distortion cancelling finger pair is not less than said length between a central line between said outer-most finger pair located outermostly of said surface acoustic wave device and a central line between a finger pair adjacent to said outer-most finger pair.

6. A surface acoustic wave device comprising a surface acoustic wave substrate and a pair of interdigital electrodes formed on said substrate, each of said electrodes having a bus bar and a plurality of electrode fingers extending from said bus bar generally perpendicular thereto and interdigitated with electrode fingers of the other electrode so that finger pairs are formed between adjacent electrode fingers extending from different bus bars, wherein:

at least one withdrawal weighting gap is provided with respect to said pair of interdigital electrodes on said substrate such that said electrode fingers of said pair of interdigital electrodes are divided into a plurality of electrode finger groups, and no finger exists in said gap to form a nonexciting portion in said surface acoustic wave device, each of said electrode finger groups including electrode fingers regularly arranged with a predetermined pitch, said withdrawal weighting gap of said nonexciting portion having a width as viewed in a surface acoustic wave propagating direction equal to a distance between one electrode finger and another electrode finger not adjacent to said one electrode finger in said regularly arranged electrode fingers, said nonexciting portion causing a distortion of distribution of an electric field to be generated by electrode fingers of said pair of interdigital electrodes when an electric voltage is applied across said bus bars with all of said electrode fingers of said pair of interdigital electrodes being arranged with said predetermined pitch; and each of two centrally located electrode finger pairs centrally located in each of said electrode finger groups is arranged such that a length between a central line between said centrally located finger pair and a central line between a finger pair outwardly adjacent to said centrally located finger pair is smaller than a length between central lines between other adjacent two finger pairs in said regularly arranged electrode fingers in an associated electrode finger group to cancel said distortion of said electric field distribution, said central lines being viewed generally in a lengthwise direction of said electrode fingers.

7. A surface acoustic wave device according to claim 2, wherein:
said pair of interdigital electrodes have a split electrode structure; and
a difference r between said length between a central line between said distortion cancelling finger pair adjacent to said one nonexciting portion and a central line between a finger pair adjacent to said distortion cancelling finger pair and
said length between central lines between other adjacent two finger pairs in said regularly arranged electrode fingers in said electrode finger groups satisfies the following relation $$0 < r < v/(16f_0)$$

where v represents a speed of propagation of a surface acoustic wave signal to be generated upon said application of an electric voltage across said bus bars, and $f_0$ represents a center frequency of said surface acoustic wave device, while said length between central lines between other adjacent two finger pairs in said regularly arranged electrode fingers in said electrode finger groups is $v/(2f_0)$.

8. A surface acoustic wave device according to claim 2, wherein:
said pair of interdigital electrodes have a solid electrode structure; and
a difference r between said length between a central line between said distortion cancelling finger pair adjacent to said one nonexciting portion and a central line between a finger pair adjacent to said distortion cancelling finger pair and
said length between central lines between other adjacent two finger pairs in said regularly arranged electrode fingers in said electrode finger groups satisfies the following relation $$0 < r < v/(8f_0)$$

where v represents a speed of propagation of a surface acoustic wave signal to be generated upon said application of an electric voltage across said bus bars, and $f_0$ represents a center frequency of said surface acoustic wave device, while said length between central lines between other adjacent two finger pairs in said regularly arranged electrode fingers in said electrode finger groups is $v/(2f_0)$.

9. A communication apparatus including a surface acoustic wave device defined in claim 7, said device serving as an intermediate frequency filter.

10. A communication apparatus including a surface acoustic wave device defined in claim 8, said device serving as an intermediate frequency filter.

11. A television receiver including a surface acoustic wave device defined in claim 7, said device serving as an intermediate frequency filter.

12. A television receiver including a surface acoustic wave device defined in claim 8, said device serving as an intermediate frequency filter.

13. A surface acoustic wave device according to claim 2, wherein one finger of said each distortion cancelling finger pair adjacent to said one nonexciting portion which is farther from said one nonexciting portion than the other finger, has a finger width as viewed in said acoustic wave signal propagating direction which is larger than a width of the electrode fingers in said regularly arranged electrode fingers as viewed in said direction, in order to effect said arrangement of said distortion cancelling finger pair.

14. A surface acoustic wave device according to claim 2, wherein one finger of said each distortion cancelling finger pair adjacent to said one nonexciting portion which is farther from said one nonexciting portion than the other finger, has a finger width as viewed in said acoustic wave signal propagating direction which is larger than a finger width of electrode fingers in said regularly arranged electrode fingers as viewed in said direction, and said other finger of said distortion cancelling finger pair has a finger width as viewed in said acoustic wave signal propagating direction which is smaller than a finger width of electrode fingers in said regularly arranged electrode fingers as viewed in said direction, to effect said arrangement of said distortion cancelling finger pair.

* * * * *